United States Patent

Imahashi

[11] Patent Number: 5,338,362
[45] Date of Patent: Aug. 16, 1994

[54] APPARATUS FOR PROCESSING SEMICONDUCTOR WAFER COMPRISING CONTINUOUSLY ROTATING WAFER TABLE AND PLURAL CHAMBER COMPARTMENTS

[75] Inventor: Issei Imahashi, Yamanashi, Japan
[73] Assignee: Tokyo Electron Limited, Tokyo, Japan
[21] Appl. No.: 111,891
[22] Filed: Aug. 26, 1993
[30] Foreign Application Priority Data Aug. 29, 1992 [JP] Japan ................. 4-253960

[51] Int. Cl.⁵ .............. C23C 16/00; C23C 16/46; C23C 16/50
[52] U.S. Cl. .............. 118/719; 118/723 ER; 118/725; 118/730
[58] Field of Search ........... 118/719, 723 E, 723 ER, 118/723 ME, 723 MR, 725, 728, 730, 733

[56] References Cited

U.S. PATENT DOCUMENTS

| | | | |
|---|---|---|---|
| 4,951,603 | 8/1990 | Yoshino et al. | 118/719 |
| 4,976,996 | 12/1990 | Monkowski et al. | 118/719 X |
| 4,987,856 | 1/1991 | Hey et al. | 118/730 X |
| 5,201,994 | 4/1993 | Nonaka et al. | |
| 5,261,959 | 11/1993 | Gasworth | 118/719 |
| 5,281,274 | 1/1994 | Yoder | 118/719 X |

FOREIGN PATENT DOCUMENTS 61-190068  8/1986  Japan.
3-72077  3/1991  Japan.

*Primary Examiner*—Brian E. Hearn
*Assistant Examiner*—Jonathan D. Baskin
*Attorney, Agent, or Firm*—Oblon, Spivak, McClelland, Maier & Neustadt

[57] ABSTRACT

An apparatus for forming a CVD film on semiconductor wafers includes a process chamber in which a rotary table capable of loading five wafers is provided. The interior of the process chamber is divided into six compartments by radially arranged partitions. The compartments comprise a wafer exchanging room for loading and unloading wafers, a first process room for forming a silicon film on the wafers, a second process room for oxidizing the silicon film into silicon oxide film and three exhaust rooms provided between the wafer exchanging room, the first process room and the second process room. The wafers are processed on the continuously rotating table. As the table is rotated, the wafers are processed in the first and second process rooms and unnecessary products produced in them are successively removed in the exhaust rooms.

18 Claims, 6 Drawing Sheets

APPARATUS FOR PROCESSING SEMICONDUCTOR WAFER COMPRISING CONTINUOUSLY ROTATING WAFER TABLE AND PLURAL CHAMBER COMPARTMENTS

BACKGROUND OF THE INVENTION

1. Field of the Invention

This invention relates to an apparatus for processing a semiconductor wafer and more particularly to an apparatus for performing a film-forming process by means of the CVD method (the chemical vapor deposition method).

2. Description of the Related Art

Etching apparatuses and CVD apparatuses have been widely used in processes for manufacturing semiconductors. As the structure of semiconductors has recently become finer, it has become more and more important that etching accuracies and the qualities of formed films be improved, and a plurality of reactive gases have been more and more frequently used to perform required etching and form required films.

With a plasma etching apparatus, a reactive gas is introduced into a process chamber under a reduced pressure, and semiconductor wafers are etched in a required manner by a physico-chemical reaction of the reactive gases in a plasma state. When wafers having fine processing holes are etched, it is required that the used gas after etching be removed efficiently. With the conventional etching apparatus, it is difficult to efficiently introduce an etching gas into and exhaust the same from fine processing holes.

The CVD apparatus is so constructed that a plurality of reactive gases are introduced into a process chamber under a reduced pressure and chemically react on semiconductor wafers to form predetermined thin films on them. It is known in the experimental stage that it is effective to laminate several hundred layers of extremely thin films (each about five angstroms in thickness, for example) on one after another in order to improve the film properties. With the conventional CVD apparatus, however, the process for forming such laminated films is complicated and requires a long time. It is, therefore, practically difficult to perform this process.

A so-called pulse CVD method by which two different gases are alternately supplied to the process chamber in a pulsing manner has been proposed to form reaction products of two highly reactive gasses as films on the wafers, or to form GaAs layers on the wafers by alternately laminating Ga thin films and As thin films. With this method, the thickness of the films is accurately controlled and only gas part adsorbed onto the wafer surfaces is used for film formation, resulting in the improvement of the film quality. With the conventional CVD apparatus, however, the process for supplying two gases alternately is complicated and requires a long time. Thus, it is difficult to perform the process practically with the conventional CVD apparatus.

Published Unexamined Japanese Patent Application No. 3-72077 discloses an apparatus for forming a silicon oxide film by a method similar to the pulse CVD method by using a rotary substrate holder. The apparatus as shown in FIGS. 1 and 2 of this publication has a substrate holder 2 provided in the upper portion of the inside of a vacuum chamber 1. The holder 2 carries four substrates 4 and is rotated at a high speed of about 60 rpm. The vacuum chamber 1 is divided into two compartments by a partition 31. A gas mixture of tetraethoxyorthosilicate (TEOS) and ozone is supplied from a gas inlet 15 to one of the compartments to process the substrates 4. Oxygen is supplied from a gas inlet 18 to the other compartment and is made into plasma 20 to plasma-process the substrates 4. Outlets 29 and 30 are provided on the sides of both compartments, respectively.

With this apparatus, however, the processing gases in both compartments enter mutually due to rotation of the holder 2 and a gap formed above the partition 31, and the processing gases chemically react not on the wafers but in the above space to produce products. The products formed in the space do not constitute material of the film formed on the wafers, but fall down onto the substrates 4 and become contaminant.

SUMMARY OF THE INVENTION

The object of this invention is to provide an apparatus for processing semiconductor wafers which can prevent unnecessary interference between processing gases in the course of a plurality of processes.

According to a first aspect of the invention, there is provided an apparatus for processing a semiconductor wafer, comprising: a process chamber; a table arranged in the process chamber; a supporting portion formed on the table, for supporting a wafer which has a main surface to be processed; means for continuously rotating the table, the table being rotated about an axis which is positioned outside the wafer on the supporting portion and a circulation route of the wafer being defined by rotation of the table; partition means for dividing the process chamber into a plurality of compartments arranged along the circulation route with a clearance being defined between the table and an opposing portion of the partition means, the compartments including a first process room and a second process room; exhausting means for evacuating a space including the first and second process rooms in the process chamber; first supplying means for supplying a first gas to the first process room; and second supplying means for supplying, to the second process room, active species of a second gas which is different from the first gas, the second supplying means having exciting means for making the second gas into plasma, the exciting means being provided remote from the second process room so as to prevent ions in the plasma from being supplied to the second process room, wherein the wafer passes the first and second process rooms by continuous rotation of the table, and the first gas and the active species of the second gases are supplied alternately to the wafer to form on the wafer a reaction product, as a film, produced by chemical reaction of the first gas and the active species of the second gas.

According to a second aspect of the invention, there is provided an apparatus for processing a semiconductor wafer, comprising: a process chamber; a table arranged in the process chamber; a supporting portion formed on the table, for supporting a wafer which has a main surface to be processed; means for continuously rotating the table, the table being rotated about an axis which is positioned outside the wafer on the supporting portion and a circulation route of the wafer being defined by rotation of the table; partition means for dividing the process chamber into a plurality of compartments arranged along the circulation route with a clearance being defined between the table and an opposing portion of the partition means, the compartments including a first process room, a second process room, a first exhaust room and a second exhaust room, the first exhaust room being provided between the first and second process rooms along the circulation route, the second exhaust room being provided between the second and first process rooms along the circulation route; exhausting means for evacuating a space including the first and second process rooms and the first and second exhaust rooms in the process chamber; first supplying means for supplying a first gas to the first process room; and second supplying means for supplying, to the second process room, a second gas which is different from the first gas, wherein the wafer passes the first and second process rooms by continuous rotation of the table, and the first and second gases are supplied alternately onto the wafer so as to apply different processes to the wafer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and together with the general description given above and the detailed description of the preferred embodiments given below, serve to explain the principles of the invention.

DETAILED DESCRIPTION OF THE PREFERRED EMBODIMENTS

Figure 1:
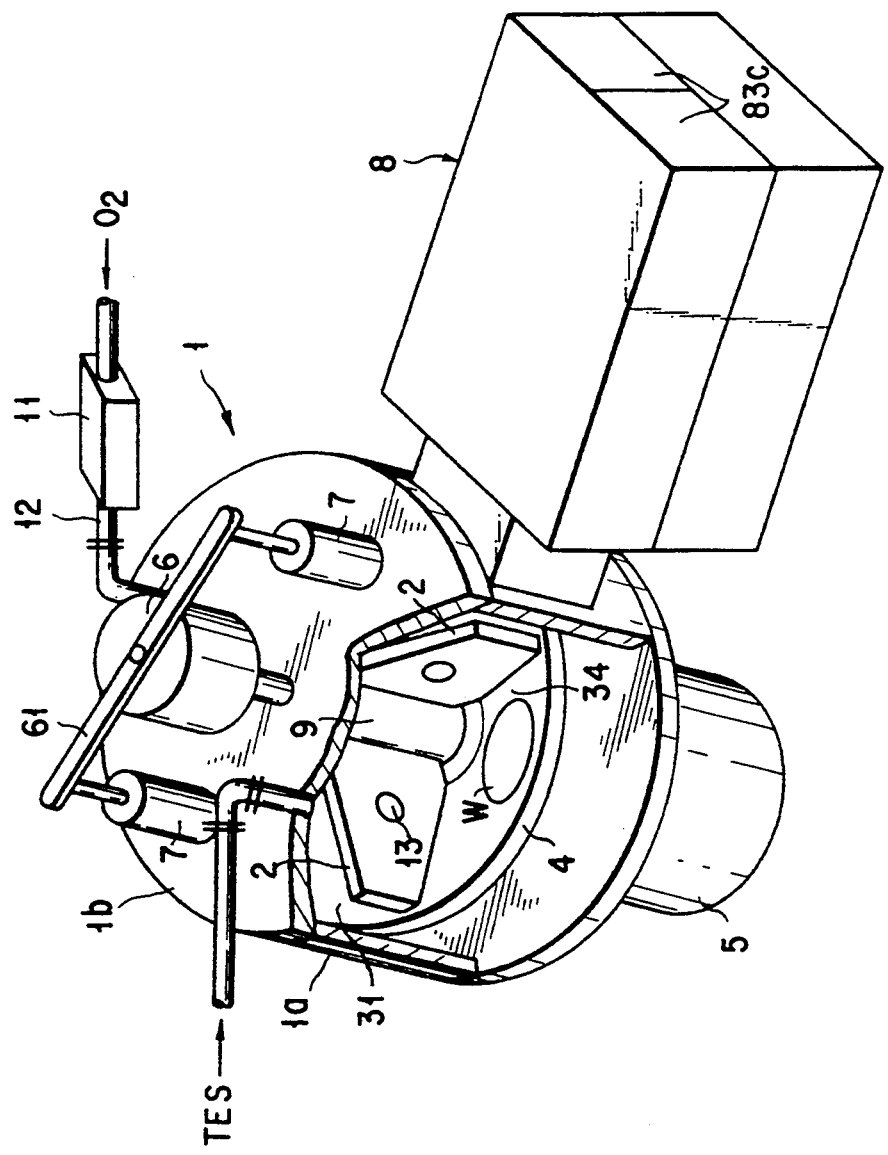
FIG. 1 is a perspective view of a processing apparatus according to one embodiment of this invention.

A processing apparatus according to a first embodiment of this invention, shown in FIG. 1, has a cylindrical process chamber 1 in which a vacuum state is produced. The interior of the process chamber 1 is divided into six compartments 31–36 by partitions 2 radially extending from a central sleeve 9 to the peripheral wall 1a of the process chamber 1. The compartments 31–36 comprise a wafer exchanging room 33 for loading and unloading wafers W, first and second process rooms 31 and 32 in which the wafers W are processed, and three exhaust rooms 34–36 disposed between the rooms 31, 32 and 33, respectively. The wafer exchanging room 33 is formed slightly larger than the other rooms such that a transfer arm 84 described later can operate therein.

Figure 3:
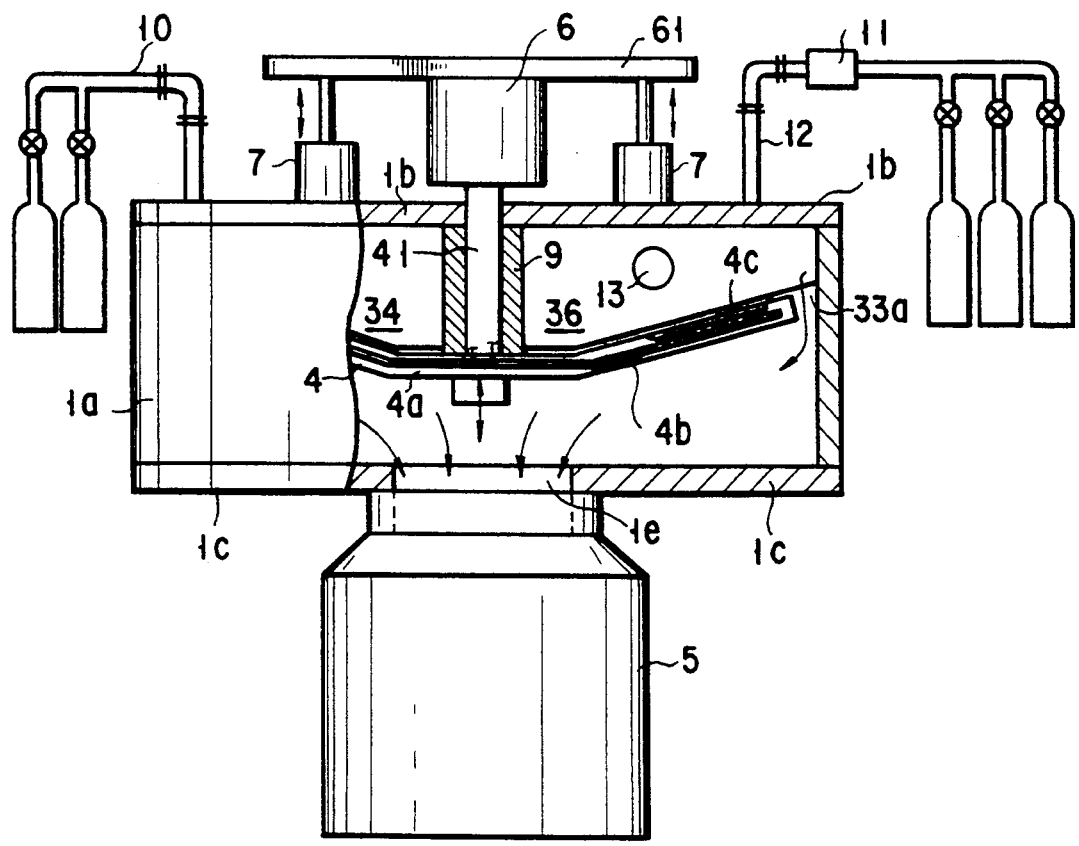
FIG. 3 is a cross sectional view along line III—III of FIG. 2.

As shown in FIG. 3, the sleeve 9 in the center of the process chamber 1 is suspended from the upper plate 1b to the substantial central portion of the process chamber 1. The partitions 2 are suspended from the upper plate 1b to form a fin shape. The inner side of each partition 2 is connected to the outer surface of the sleeve 9 and extends to the lower end of the sleeve 9. The outer side of the partition 2 is connected to the inner surface of the peripheral wall 1a and extends from the upper portion of the peripheral wall 1a to its upper one-third portion.

Figure 4:
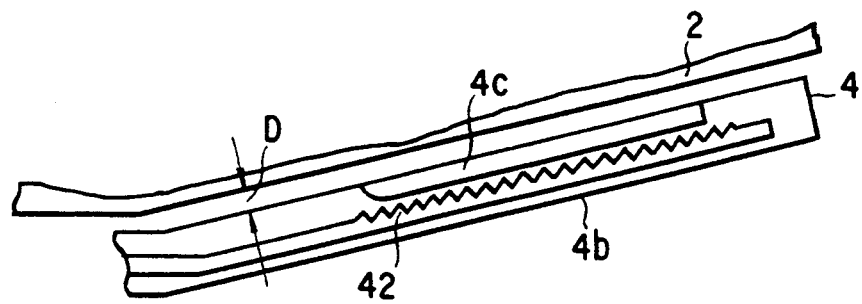
FIG. 4 is an enlarged cross-sectional view of part of the processing apparatus shown in FIG. 1.

A substantially cylindrical, electrically conducting rotary table 4 is provided opposed to the lower side of each partition 2. As shown in FIG. 4, the table 4 extends along the lower side of the partition 2 with a constant small gap D (1 to 2 mm, for example) being spaced from the lower side of the partition 2 such that the bottom wall of each of the six compartments 31–36 are defined by the table 4. Five wafers can be loaded equidistantly on the table 4.

An opening 1e is formed in the center of the bottom plate 1c of the process chamber 1. A vacuum pump 5 is hermetically connected to the opening 1e. The whole interior of the process chamber 1 including the compartments is made in a vacuum state by means of the vacuum pump 5. The vacuum pump 5 comprises such a turbo molecular pump, a mechanical pump, or the like as can evacuate the interior of the process chamber 1 to the degree of $10^{-7}$ Torr.

To the center of the table 4, fixed is a shaft 41 which extends through the sleeve 9 in vacuum sealed state and the upper plate 1a of the process chamber 1. A motor 6 is connected to the shaft 41 and fixed by a supporting frame 61 to a pair of lifters 7 comprising a mechanism such as ball screws. The table 4 takes a turned-over umbrella shape and is supported by the process chamber 1. The table 4 is rotated at a speed of 10 revolutions/second (rps), for example, and is lifted or lowered by the lifters 7.

More specifically, the table 4, as shown in FIG. 3, has a central horizontal portion 4a and an inclined peripheral portion 4b which extends outward and upward. As shown in FIG. 4, five recesses 4c each having a flat bottom, a diameter substantially equal to the outer diameter of the wafer w and a depth substantially equal to the thickness of the wafer W are arranged circumferentially and equidistantly. A wafer W can be loaded in each recess 4c.

A heater 42 for heating a wafer W is disposed under the corresponding recess 4c and supported by the table 4. The heater 42 comprises a resistance heat generator which enables the set temperature to be changed by adjusting a supplied voltage to a power source, which is connected to the heater 42 by a lead passing through an axial hole formed in the shaft 41. The temperature of the heaters 42 can be controlled independently according to the conditions of the corresponding recesses 4c.

Figure 9:
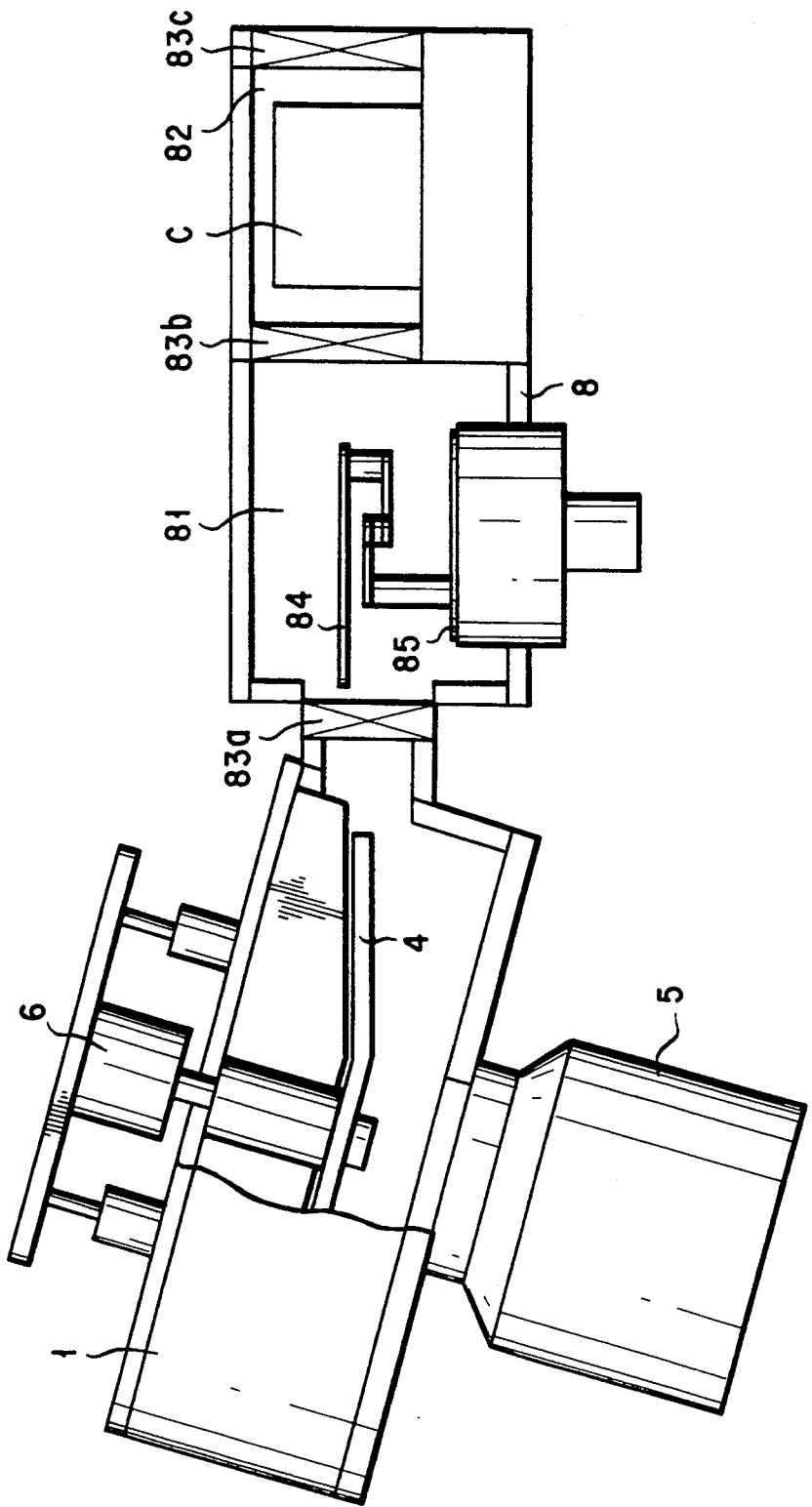
FIG. 9 is a cross-sectional side view schematically showing the processing apparatus shown in FIG. 1 to explain the positional relationship between the process chamber and the transfer section of the apparatus.

As shown in FIG. 9, the process chamber 1 and the rotational axis of the table 4 are inclined such that a portion of the table 4, which is positioned in the wafer exchanging room 33 during rotation of the table 4, is set substantially horizontal.

In other words, a wafer w mounted on each recess 4c comes into a substantially horizontal state, when the corresponding recess 4C enters in the wafer exchanging room 33. A transfer section 8 having the transfer arm 84 is horizontally connected to the wafer exchanging room 33, so that the arm 84 transfers a wafer w in horizontal state.

Figure 5:
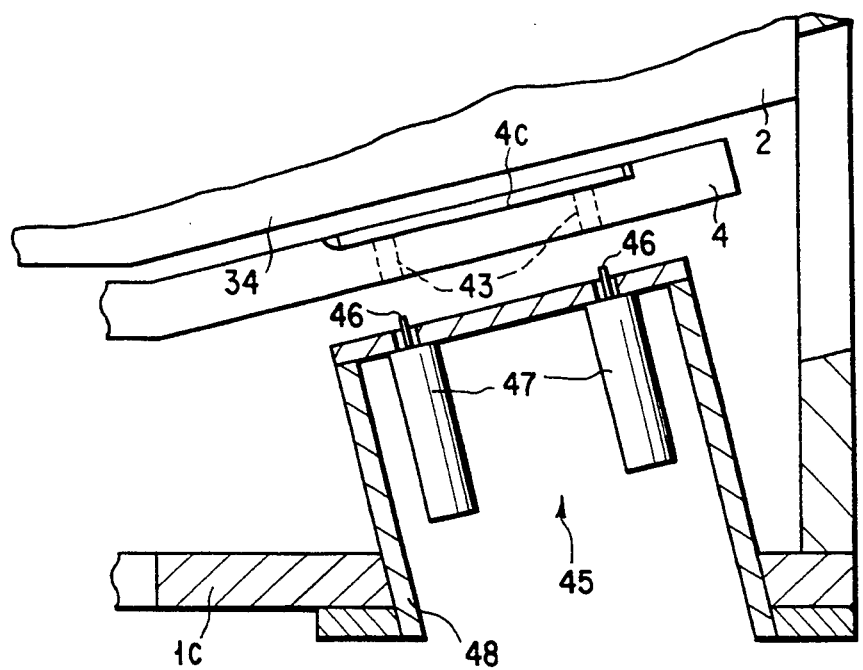
FIG. 5 is an enlarged partial cross-sectional view of the lower portion of the wafer exchanging room of the processing apparatus shown in FIG. 1.

Three holes 43 extending vertically through the table 4 are formed in each recess 4c. As shown in FIG. 5, the holes 43 are formed to engage with three lifting pins 46 of a wafer lifting member 45 provided to the wafer exchanging room 33. The pins 46 vertically project from the holes 43 and lift and lower a wafer w, making it possible to load a wafer W on and unloading the same from the corresponding recess 4c by the transfer arm 84.

In this embodiment, the lifting pins 46 are driven by actuators 47 operating independently from each other and their projecting lengths are individually adjusted. However, it is possible to provide three lifting pins 46 on a supporting plate such that they are driven as a unit. The actuators 47 are fixed to the supporting frame 48 so as to be disposed outside of the process chamber 1. The supporting frame 48 is hermetically fixed to the opening of the bottom plate 1c of the process chamber 1 by means of fixing means such as screws.

Referring to FIG. 2 again, the transfer section 8 is disposed adjacent to the wafer exchanging room 34 and connected to the process chamber 1. The transfer section 8 comprises first and second load lock chambers 81 and 82 whose pressures can be adjusted individually. More specifically, the first and second load lock chambers 81 and 82 are connected to their own exhaust lines, respectively, and supply lines of purge gas such as nitrogen, respectively. The use of two-stage load lock chambers permits the degree of vacuum in the process chamber 1 to be always maintained at a predetermined value.

The first load lock chamber 81 is used as a handling room and connected to the process chamber 1 via a gate 83a. In the load lock chamber 81, provided is the wafer transfer arm 84 which comprises a plurality of arm elements linked together and is supported on a rotary base 85. Thus, the arm 84 can be extended, retracted and rotated.

The second load lock chamber 82 is used as a cassette loading room and connected to the first load lock chamber 81 through two gates 83b. The second load lock chamber 82 is provided with two outer gates 83c at positions opposite to the gates 83b. Two wafer cassettes C are transferred into the second load lock chamber 82 through the gates 83c. A plurality of wafers w are loaded in each cassette C.

Unprocessed wafers W in one of the cassettes C are taken out one by one by the arm 84 and horizontally transported to and loaded on one of recesses 4c of the table 4 positioned in the wafer exchanging room 34. The processed wafers w on the table 4 is horizontally transferred from the table 4 and inserted in one of the cassettes C by the arm 84.

In this embodiment, the first process room 31 which is one of the six compartments 31-36 are used for forming thin films on the wafers by means of the CVD method. As shown in FIGS. 1 and 3, a gas supply pipe 10 is connected to the upper plate 1b of the process chamber 1 at the process room 31. To the gas supply pipe 10, connected is gas material sources such as a triethylsilane (TES) source and a hydrogen source. TES and hydrogen are mixed with each other and introduced into the first process room 31 and react to form silicon films on the wafers W. The mixing ratio of TES to hydrogen can be properly adjusted according to its necessity. Gas material usable for forming silicon films can be organic silane gas such as monoethylsilane, diethylsilane, trimethylsilane, monomethylsilane or dimethylsilane gas, in addition to TES gas.

In this embodiment, the second process room 32 is used for oxidizing or nitrifying the thin films formed on the wafers W. A gas supply pipe 12 provided with a microwave discharging portion 11 is connected to the upper plate 1b of the process chamber 1 at the process room 32. To the gas supply pipe 12, connected is a gas material source for supplying the gas material such as oxygen, ammonia, argon or the like. A gas source for supplying hydrogen gas or inert gas other than argon can be connected to the gas supply pipe 12.

One of the gas materials is made into plasma by means of the microwave discharging portion 11 and is supplied to the second process room 32 as active species or radicals, i.e., in a state in which there are no ions. Because it is not preferable that ions be transferred to the second process room 32. In this state, the wafers are transferred from an atmosphere of a non-ionized state to an atmosphere of an ionized state, and vice versa. Thus, the wafers are charged to a high potential locally or partly. As a result, the wafers are likely to be damaged. In particular, when semiconductor device elements are formed on the wafers, the elements are likely to be broken.

In order to avoid this problem, the position of the microwave discharging portion 11 is selected such that the ions in the plasma of the gas material do not enter the second process room 32. The ions in the plasma have a shorter life than the active species. In other words, soon after the ions leave the microwave discharging portion 11, they are combined with electrons and made into an electrically neutral state.

An opposing electrode 51 is connected by an insulating tube 52 to the portion of the upper plate 1b which corresponds to the second process room 32. A high frequency potential such as 13.56 MHz is applied from a power source 53 to the opposing electrode 51. The electrically conductive table 4 is grounded. The gas material can be made into plasma by a high frequency electric field produced between the table and the opposing electrode 51. When, for example, a natural oxide film exists on the surface of a wafer W, argon is made into plasma in the second process room 32 as a preprocess for forming a thin film so as to etch the natural oxide film. In this case, each wafer W is preprocessed with the table 4 stopped.

In the gas exhaust rooms 34-36 and the wafer exchanging room 33, formed are channels 33a-36a between the inner surface of the peripheral wall 1a and the outer periphery of the table 4. While the vacuum pump 5 is operating, the gas in the gas exhaust rooms 34-36 passes the channels 34a-36a and arrives at the lower space of the process chamber 1 to be sucked in by the vacuum pump 5.

Figure 2:
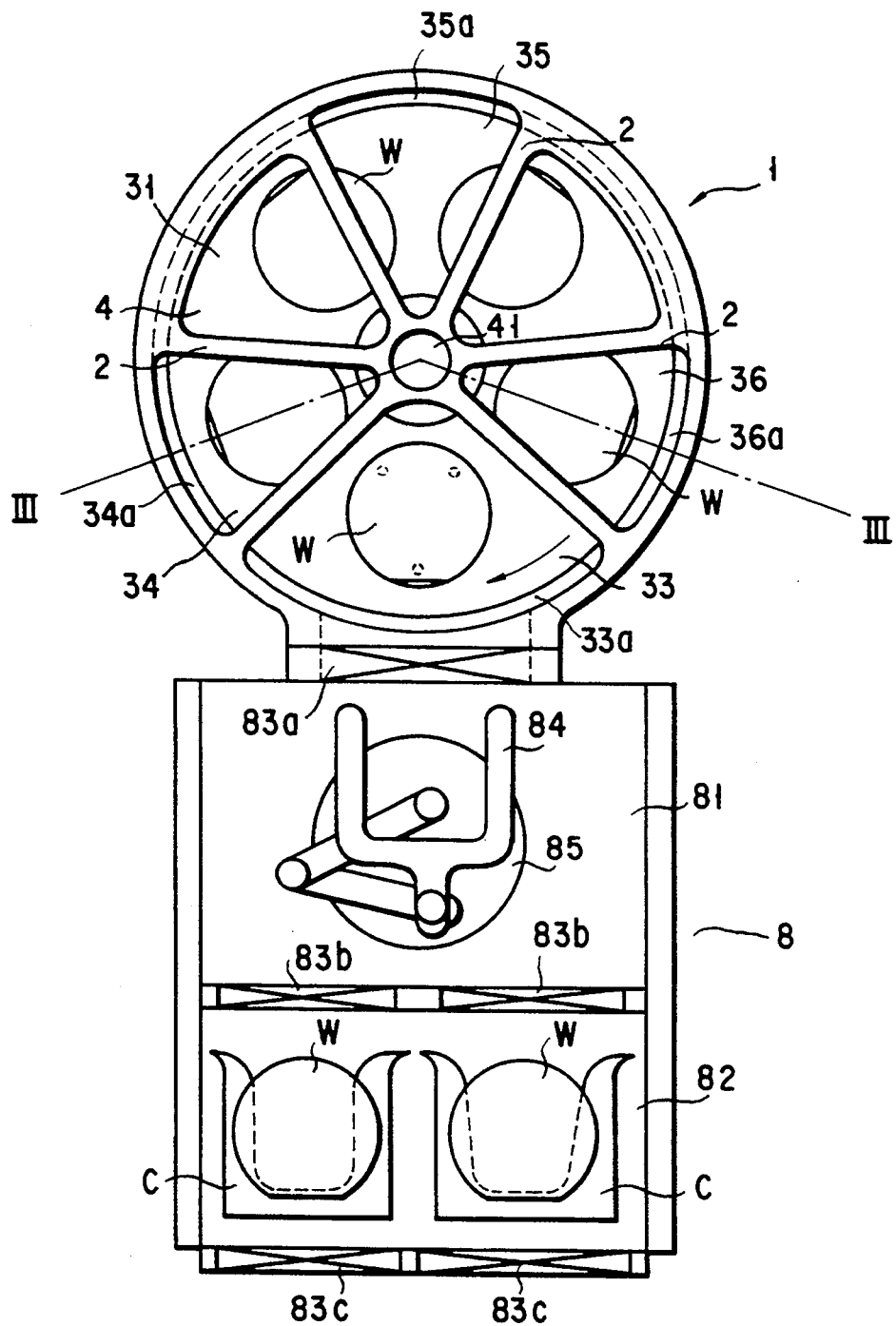
FIG. 2 is a horizontal cross-sectional view of the process chamber of the processing apparatus shown in FIG. 1.
Figure 6:
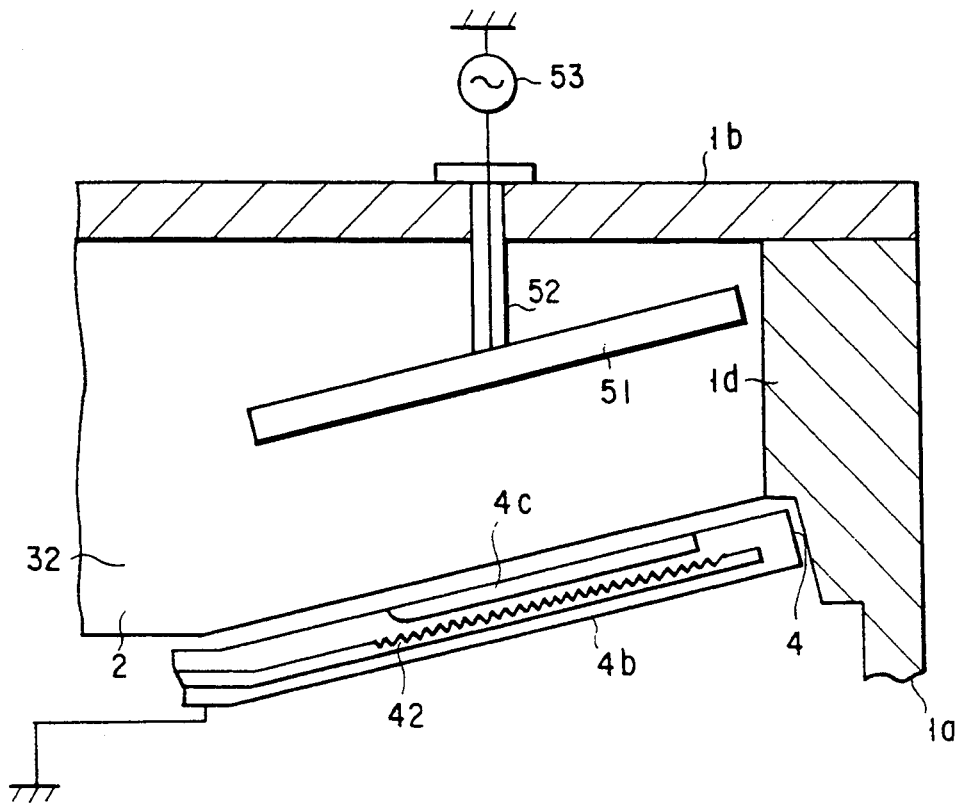
FIG. 6 is an enlarged partial cross-sectional view of the second process room of the processing apparatus shown in FIG. 1.

As shown in FIGS. 2 and 6, the portions of the peripheral wall 1a which correspond to the process rooms 31 and 32 are formed as thick portions 1d such that the outer peripheral portion of the table 4 is disposed under them. The inner surfaces of the thick portions 1d is formed so as to extend along the profile of the outer peripheral portion of the table 4, with few clearance existing between the thick portions 1d and the table 4. Thus, the gas in the process rooms 31 and 32 is rarely exhausted from the gaps between the thick portions 1d and the table 4. Instead, the gas passes through the gap having a width D defined between the partitions 2 and the table 4, enters the adjacent gas exhaust rooms 34-36 first, and then is exhausted through the channels 34a–36a.

As shown in FIG. 3, the process rooms 31 and 32 are provided with a passageway which is formed on the partitions 2 and is opened and closed by the gate 13. The exhaust speeds of the gas in the first and second process rooms 31 and 32 can be adjusted by opening and closing of the respective gates 13. The gap or width D between the partitions 2 and the table 4 is usually set to 1 to 2 mm but can be adjusted to another required dimension by means of the lifters 7 so that a suitable vacuum state is established in each of the process rooms 31 and 32.

The processing apparatus according to this embodiment will now be described.

First, the two gates 83c of the second load lock chamber 82 of the transfer section 8 are opened and wafer cassettes C are loaded into the second load lock chambers 82 through the gates 83c. Next, the interior of the second load lock chamber 82 is evacuated to the same vacuum degree as that of the first load lock chamber 81. Then, the two gates 83b are opened to make the second load lock chamber 82 communicate with the first load lock chamber 81. Thereafter, a wafer W is taken out from one of the wafer cassettes C by driving the arm 84 and this wafer W is loaded on the recess 4c of the table 4 which is disposed in the wafer exchanging room 33.

In this condition, the lifting pins 46 project upward from the holes 43 of the recess 4c to hold the wafer W substantially horizontally, and then the pins 46 are lowered to load the wafer w on the recess 4c. After that, the table 4 is rotated by 1/5 revolution in the arrow direction shown in FIG. 2 and the next recess 4c is placed in the wafer exchanging room 33. The next wafer W is then loaded on this next recess 4c in the same way as for the first wafer W. This process is repeated and the gates 83b are closed after wafers w have been loaded on all recesses 4c.

When natural oxide films on the wafers W are removed in the preprocess, since plasma is used, the movement of the tale 4 is stopped and a wafer W is placed in the second process room 32. Then, only the wafer W loaded in the second process room 32 is heated to about 250° C. by the heater 42. Together with this, argon gas is introduced into the second process room 32 and a high electric power such as 300W is applied to the opposing electrode 51 to produce argon-gas plasma. The natural oxide film on the wafer W is etched and removed by the plasma. The natural oxide films are removed while the wafers are carried one by one into the second process room 32 and stay there with the table 4 stopped rotating.

After the preprocess, the following film formation on all wafers is performed simultaneously by rotating the table 4 and heating all heaters 42. As the rotational speed of the table 4 increases by gradually elevating the speed of the motor 6, the wafers w are gradually more strongly pressed against the bottoms of the recesses 4c by the centrifugal forces exerted on the wafers W. Each wafer W is influenced by the vector component of the centrifugal force in the radial direction. Since, however, the peripheral edge of the w abuts against the peripheral wall of the recess 4c, the wafer W is securely held in the recess 4c.

When the rotational speed of the table 4 has come to a predetermined value such as 10 rps and the temperature of the wafers W has come to a predetermined value such as 250° C., gas materials are supplied to the first and second process rooms 31 and 32. A gas mixture comprising TES gas and hydrogen gas (TES/hydrogen = 4/6, for example) is introduced from the pipe 10 into the first process room 31. In this case, the supplying pressure of the gas material is set to about 1 Torr, for example. Oxygen radicals obtained from oxygen formed into plasma by means of the microwave discharging portion 11 which discharges 2.45 GHz microwaves are introduced from the pipe 12 into the second process room 32. In this case, the supplying pressure of the gas material is also set to about 1 Torr, for example.

In the first process room 31, silicon produced by the chemical reaction of the gas material is adhered to the moving wafer W and forms a silicon film on it. The portion of the produced gas which is not used for film formation is exhausted quickly from the channel 35a of the gas exhaust room 35. In order to do so, the pressure in the first process chamber 31 is set to about several hundreds mTorr, for example. The wafer W is moved to the adjacent gas exhaust room 35 and then to the second process room 32 such that floating matters such as non-used gas and unnecessary products are removed in the exhaust room. A silicon film is oxidized by oxygen radicals to be formed into a silicon oxide film in the second process room 32. The pressure in the second process room 32 is also set to abut several hundreds mTorr, for example. Then, floating matters such as non-used gas and unnecessary products are removed in the next exhaust room 36 by the further rotation of the table 4, and the film formation is repeated continuously.

Because the table 4 is rotated at a rotational speed of 10 rps, the process time of each wafer w is shortened to the order of 15 msec. This process time is sufficient for absorbing processing gas for film formation and a molecule layer film having a thickness of the order of 5 angstroms can be formed in such a short time. When the film formation is repeated for five minutes by rotating the table 4, three thousand film forming processes are repeated, with the result that an oxide film having a thickness of 1.5 $\mu$m which is sufficient for an insulating film can be formed on the wafer w. The laminated film thus formed has an excellent film property which is free from defects occurring from pin holes or the like otherwise produced.

Upon completing the film formation, supply of the process gases to the process chamber 1 is stopped, and residual gases are exhausted, and the motor 6 is stopped so as to make the table 4 stationary. Then, the gates 83a and 83b are opened so as to cause the wafer exchanging room 33 to communicate with the first and second load lock chambers 81 and 82 of the transfer section 8. The lifting pins 46 are lifted and the arm 84 is driven such that the wafers w are loaded in the empty levels of the cassettes C. Thereafter, unprocessed wafers W are taken out from the cassettes C by the arm 84 and are loaded on the empty recesses 4c.

There will be described how silicon oxide films and silicon nitride films are laminated alternately on wafers by using another method in the processing apparatus according to this invention. In this case, a silicon oxide film having a thickness of 100 angstroms, for example, is formed on a wafer in the same manner as in the first embodiment. After this, the gas introduced from the gas supply pipe 12 is changed from oxygen gas to ammonia gas to supply nitrogen radicals to the second process room 32. A 100 angstrom silicon nitride film can be formed similarly to a silicon oxide film. In other words, when the silicon nitride film is formed, a silicon film is formed by supplying a mixture of TES gas and hydrogen gas to the first process room 31 in the same way as in forming a silicon oxide film, and then the silicon film is made into the silicon nitride film by the nitrogen radicals. Formation of silicon oxide films and silicon nitride films is repeated alternately required times, whereby silicon oxide films each having a thickness of 100 angstroms and silicon nitride films each also having a thickness of 100 angstroms can be alternately laminated on a wafer W.

With this process, a plurality of layers comprising different species are a laminated alternately to form a film of high quality.

The processing apparatus according to this invention is applicable to a process for forming laminate type high-dielectric film of $Ta_2O_5$ on a wafer as disclosed in co-pending U.S. Pat. application Ser. No. 07/848,019. In this case, a Ta film is formed on a wafer by introducing a gas mixture comprising $Ta(N(CH_3)_2)_5$ and hydrogen from the gas supply pipe 10 into the first process room 31, and the Ta film is oxidized by introducing oxygen radicals from the gas supply pipe 12 into the second process room 32. In this way, a $Ta_2O_5$ film having a predetermined thickness can be obtained by rotating the table 4 for a predetermined time.

The processing apparatus according to this invention is also applicable to a process for forming a GaAs film prepared by laminating Ga thin films and As thin films alternately on one after another. In this case, trimethylgallium (TMG) is introduced into the first process room 31, and arsine ($AsH_3$) into the second process room 32. The arsine is introduced in a gaseous state without using the microwave discharging portion 11. Trimethylgallium and arsine are thermally decomposed on the wafer by heating the wafer at a predetermined high temperature by the heater 42. In this process, a Ga film is formed in the first process room 31, and As film in the second process room 32. In this way, a GaAs thin film having a predetermined thickness and formed by laminating Ga thin films and As thin films on one after another can be obtained by rotating the table 4 for a predetermined time.

The processing apparatus according to this invention is further applicable to a process for forming a silicon oxidized film as disclosed in Published Unexamined Japanese Patent Application No. 3-72077. The silicon oxide film obtained by this processing apparatus has a higher quality due to the function of the gas exhaust rooms 34–36. In this case, a gas mixture of tetraethoxyorthosilicate (TEOS) and ozone is supplied to the first process room 31 and oxygen radicals are supplied to the second process room 32. Since floating matters are removed in the adjacent gas exhaust room, chemical reaction takes place only between gases adhered to the wafer surface. Different from the case in the process of No. 3-72077, oxygen is not made into plasma in the second process room 32. Because, if plasma is used in the second process room 32 with the table 4 rotating, wafers are transferred from a not-ionized atmosphere to an ionized atmosphere, resulting in undesirable conditions.

The processing apparatus according to this invention can form films by introducing different kinds of gas material into the respective process rooms and reacting only the gases adhered to the wafer surfaces on each other. In other words, film forming process corresponding to the conventional molecular beam epitaxy method can be performed on this processing apparatus. This suggests that a reaction product produced from two highly reactive gases can be formed by a CVD method at a room temperature. In other words, a high heat energy or plasma energy required for the conventional cases is not necessary, but energy generated by reaction of two reactive gases can be utilized instead.

Figure 7:
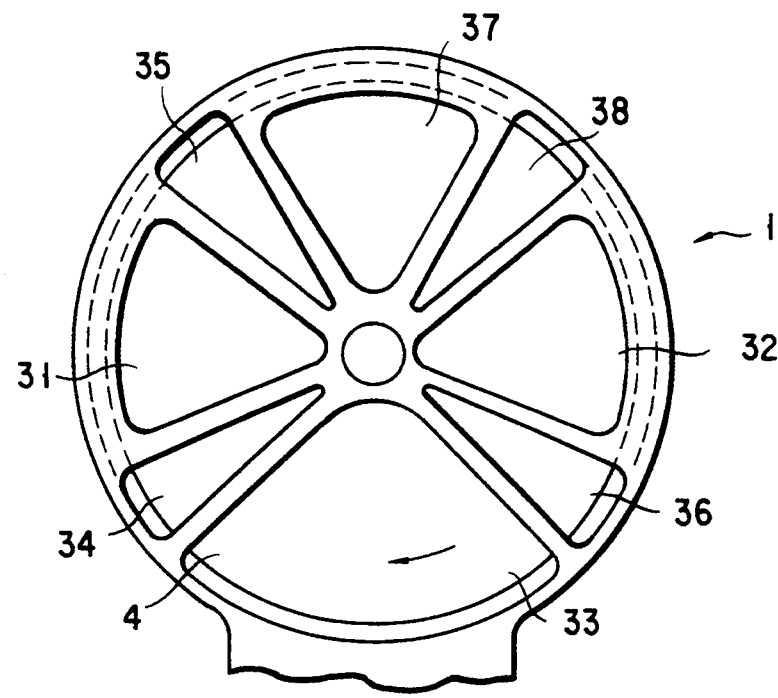
FIG. 7 is a plan view of the interior of the process chamber according to a modification.
Figure 8:
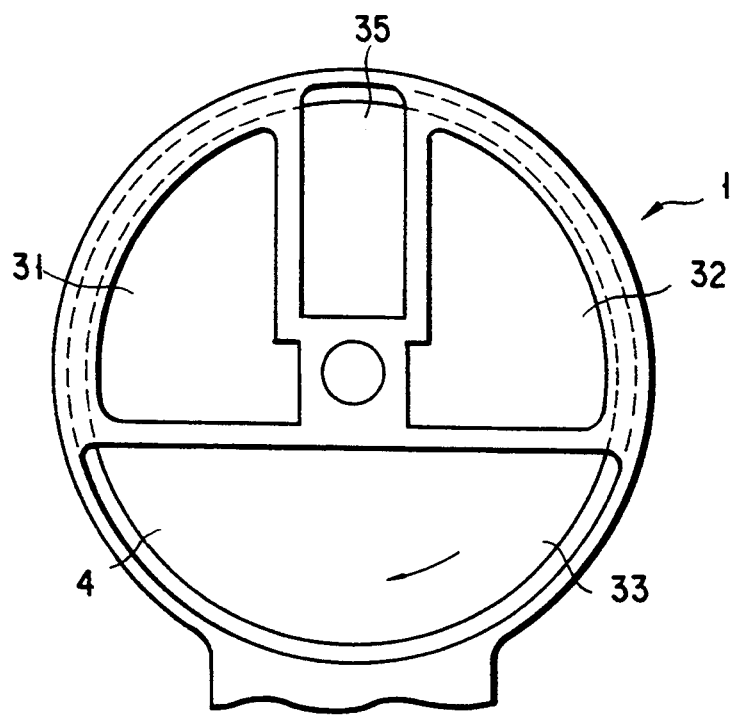
FIG. 8 is a plan view of the interior of the process chamber according to another modification.

Various modifications are available within the scope of this invention. FIGS. 7 and 8 are plan views of two modifications showing the interior of process chambers according to this invention. The same members and parts of process chambers of these figures as those of FIG. 2 are designated by the same referential numerals, and only necessary portions will be described.

In the modification shown in FIG. 7, a third process room 37, into which hydrogen radicals are introduced, and fourth exhaust room 38 are provided between the first and second process rooms 31 and 32. An organic product produced in the first process room 31 can be reduced on the wafers W by the hydrogen radicals and is removed as methane gas or the like. For example, the application of this modification to the film forming in the first embodiment allows organic products, which is produced from TES gas and is likely to be contained as contaminators in the silicon films, to be removed, thereby providing a higher quality film.

In the embodiment shown in FIG. 8, the partitions 2 are arranged at positions deviated from the center sleeve 9, but substantially the same effect can be attained as the radially extending partitions are used. As will be understood from this, the partitions 2 are not always arranged exactly in the radial directions as long as the compartments are arranged along the rotation of the table 4. As seen from FIG. 8, the first process room 31, the exhaust room 35 and the second process room 31 are arranged in this order in the rotational direction of the table 4 shown by an arrow. Likewise, the second process room 32, the wafer exchanging room 33 and the first process room 31 are arranged in this order in the rotational direction of the table 4, and the wafer exchanging room 33 functions as an exhaust room.

One of the process rooms can be used for performing etching. In this case, however, it is not preferable that plasma be used during the rotation of the table 4 by the reason as mentioned above. In this regards, a device such as the microwave discharging portion 11 of the gas introducing pipe 12 or a separate plasma producing room is used such that ions do not arrive at the etching room. Thus, the etching chemically performed by active species or radicals is used in this modification. Provision of an exhaust room behind the etching room allows for quick removal of unnecessary residual of etching gas and unnecessary products produced by etching, thereby avoiding adverse effects on the next process room.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An apparatus for processing a semiconductor wafer, comprising:
   a process chamber;
   a table arranged in said process chamber;

a supporting portion formed on said table, for supporting a wafer which has a main surface to be processed;

a mechanism for continuously rotating said table, said table being rotated about an axis which is positioned outside said wafer on said supporting portion and a circulation route of said wafer being defined by rotation of said table;

a partition for dividing said process chamber into a plurality of compartments arranged along said circulation route with a clearance being defined between said table and an opposing portion of said partition, said compartments including a first process room and a second process room;

an exhaust for evacuating a space including said first and second process rooms in said process chamber;

a first supply for supplying a first gas to said first process room; and a second supply for supplying, to said second process room, active species of a second gas which is different from said first gas, said second supply having an exciting mechanism for making said second gas into plasma, said exciting mechanism being provided remote from said second process room so as to prevent ions in the plasma from being supplied to said second process room, wherein said wafer passes through said first and second process rooms by continuous rotation of said table, and said first gas and said active species of said second gases are supplied alternately to said wafer to form on said wafer a reaction product, as a film, produced by chemical reaction of said first gas and said active species of said second gas wherein said table is provided with a plurality of supporting portions for individually supporting a plurality of wafers so as to process said wafers simultaneously; and wherein said supporting portions each have a recess for supporting one of said wafers, and are formed such that said wafers are inclined inwardly.

2. The apparatus according to claim 1, wherein said first supply has mechanism for supplying said first gas which forms a first film on said wafer in said first process room, and said second supply has a mechanism for supplying said active species of said second gas which forms a second film in said second process room by reacting on said first film.

3. The apparatus according to claim 2, wherein said first supply includes a mechanism for supplying said first gas including a plurality of gas components such that reaction products produced from said gas components form said first film on said wafer in said first process chamber.

4. The apparatus according to claim 3, wherein said table has heaters for heating said wafer.

5. The apparatus according to claim 1, wherein said supporting portions are provided on an upper surface of said table, and said wafers are mounted on said supporting portions.

6. The apparatus according to claim 1, further comprising a mechanism for lifting and lowering said table in order to adjust said clearance between said table and said opposing portion of said partition.

7. The apparatus according to claim 6, wherein said compartments include a wafer exchanging room, and said apparatus comprises a load lock chamber provided corresponding to said wafer exchanging room and connected to said process chamber through gates and a transfer mechanism provided in said load lock chamber, for transporting said wafers onto and out of said table.

8. An apparatus for processing a semiconductor wafer comprising:

a process chamber;

a table arranged in said process chamber;

a supporting portion formed on said table, for supporting a wafer which has a main surface to be processed;

a mechanism for continuously rotating said table, said table being rotated about an axis which is positioned outside said wafer on said supporting portion and a circulation route of said wafer being defined by rotation of said table;

a partition for dividing said process chamber into a plurality of compartments arranged along said circulation route with a clearance being defined between said table and an opposing portion of said partition said compartments including a first process room, a second process room, a first exhaust room and a second exhaust room, said first exhaust room being provided between said first and second process rooms along said circulation route, said second exhaust room being provided between said second and first process rooms along said circulation route;

an exhaust for evacuating a space including said first and second process rooms and said first and second exhaust rooms in said process chamber;

a first supply for supplying a first gas to said first process room; and a second supply for supplying, to said second process room, a second gas which is different from said first gas, wherein said wafer passes through said first and second process rooms by continuous rotation of said table, and said first and second gases are supplied alternately onto the wafer so as to apply different processes to said wafer wherein said table is provided with a plurality of supporting portions for individually supporting a plurality of wafers so as to process said plurality of wafers simultaneously, and wherein said supporting portions each have a recess for supporting one of said wafers, and are formed such that said wafers are inclined inwardly.

9. The apparatus according to claim 8, wherein said first and second supply include a mechanism for supplying said first and second gases for forming a film produced by chemical reaction of said first and second gases.

10. The apparatus according to claim 9, wherein said table has heaters for heating said wafer.

11. The apparatus according to claim 8, wherein said supporting portions are provided on an upper surface of said table, and said wafers are mounted on said supporting portions.

12. The apparatus according to claim 8, further comprising a mechanism for lifting and lowering said table in order to adjust said clearance between said table and said opposing portion of said partition.

13. The apparatus according to claim 12, wherein said exhaust is connected to said process chamber under said table, a gap through which gases in said first and second exhaust rooms are exhausted is provided between an inner face of said process chamber in each of said exhaust rooms and end portion of said table.

14. The apparatus according to claim 13, wherein gases in said first and second process rooms are exhausted through said clearance between said table and said opposing portion of said partition and through said first and second exhaust rooms.

15. The apparatus according to claim 14, wherein said partition comprises a plurality of substantially radially arranged partitions.

16. The apparatus according to claim 15, wherein said first process room and said first exhaust room are divided by one of said partitions, said second process room and said second exhaust room are divided by another of said partitions, and a communicating passageway having a gate is provided to each of said one and another of said partitions.

17. The apparatus according to claim 16, wherein said compartments include a wafer exchanging room, and said apparatus comprises a load lock chamber provided corresponding to said wafer exchanging room and connected to said process chamber through gates and a transfer mechanism provided in said load lock chamber, for transporting said wafers onto and out of said table.

18. The apparatus according to claim 17, wherein a gap through which gas in said wafer exchanging room is exhausted is provided between an inner face of said process chamber in said wafer exchanging room and an end portion of said table.

* * * * *